United States Patent
Flachowsky et al.

(10) Patent No.: US 8,324,041 B2
(45) Date of Patent: Dec. 4, 2012

(54) COMPLEMENTARY STRESS LINER TO IMPROVE DGO/AVT DEVICES AND POLY AND DIFFUSION RESISTORS

(75) Inventors: Stefan Flachowsky, Dresden (DE); Jan Hoentschel, Dresden (DE); Thilo Scheiper, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/023,794

(22) Filed: Feb. 9, 2011

(65) Prior Publication Data

US 2012/0199912 A1    Aug. 9, 2012

(51) Int. Cl.
*H01L 21/8238* (2006.01)

(52) U.S. Cl. ......................... 438/228; 257/365
(58) Field of Classification Search .................. 257/365; 438/228

See application file for complete search history.

(56) References Cited

U.S. PATENT DOCUMENTS 7,288,451 B2 * 10/2007 Zhu et al. ................. 438/228
2008/0251854 A1 * 10/2008 Shimooka et al. ......... 257/374

* cited by examiner

*Primary Examiner* — Douglas Menz
(74) *Attorney, Agent, or Firm* — Ditthavong Mori & Steiner, P.C.

(57) ABSTRACT

Electron mobility and hole mobility is improved in long channel semiconductor devices and resistors by employing complementary stress liners. Embodiments include forming a long channel semiconductor device on a substrate, and forming a complementary stress liner on the semiconductor device. Embodiments include forming a resistor on a substrate, and tuning the resistance of the resistor by forming a complementary stress liner on the resistor. Compressive stress liners are employed for improving electron mobility in n-type devices, and tensile stress liners are employed for improving hole mobility in p-type devices.

14 Claims, 3 Drawing Sheets

COMPLEMENTARY STRESS LINER TO IMPROVE DGO/AVT DEVICES AND POLY AND DIFFUSION RESISTORS

TECHNICAL FIELD

The present disclosure relates to semiconductor devices and resistors with stress overlayers. The present disclosure is particularly applicable in fabricating long channel transistors with improved electron and carrier mobilities and resistors with improved resistance by employing complementary stress liners.

BACKGROUND

Strain engineering using stress nitride overlayers is commonly employed in CMOS technologies for enhancing channel carrier mobility in short channel devices. Performance of NFETS may be improved by applying a stressed nitride layer exhibiting high tensile stress for increasing electron mobility. Similarly, PFET performance may be improved by applying a stressed layer exhibiting high compressive stress for increasing hole mobility. However, for long channel devices, the same stress layers degrade circuit performance, and, therefore, are undesirable. Unfortunately, since all designs use a combination of devices and structures having different dimensions, such as thick gate oxide or dual gate oxide (DGO) devices, analog devices (AVT), and passive devices, such as fuses, diffusion resistors, or poly resistors, elimination of stressed overlayers would degrade the performance of the short channel devices.

A need therefore exists for methodology enabling optimization of the application of stress overlayers to target the electrical behavior of semiconductor devices.

SUMMARY

An aspect of the present disclosure is an improved method of forming a long channel semiconductor device by providing a complementary stress liner.

Another aspect of the present disclosure is a long channel semiconductor device including a complementary stress liner.

A further aspect of the present disclosure is a method of controlling resistance of a resistor by providing a complementary stress liner.

Another aspect of the present disclosure is a resistor including a complementary stress liner.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of forming a long channel semiconductor device on a substrate; and forming a complementary stress liner on the semiconductor device.

Aspects of the present disclosure include forming a dual gate oxide device as the long channel device. Further aspects include forming an NFET dual gate oxide device; and forming a compressive stress liner as the complementary stress liner. Other aspects include forming a PFET dual gate oxide device; and forming a tensile stress liner as the complementary stress liner. Another aspect includes forming an analog device as the long channel device. Additional aspects include forming an analog NFET device; and forming a compressive stress liner as the complementary stress liner. Further aspects include forming an analog PFET device; and forming a tensile stress liner as the complementary stress liner.

Another aspect of the present disclosure is a device including: a long channel transistor; and a complementary stress liner on the transistor. Aspects include a device wherein the transistor is a dual gate oxide. Another aspect includes the transistor being an analog device. Further aspects include a device including an NFET transistor and compressive stress liner. Other aspects include a device including a PFET transistor and a tensile stress liner.

Another aspect of the present disclosure is a method including: forming a resistor on a substrate; and tuning the resistance of the resistor by forming a complementary stress liner on the resistor. Aspects include forming an n-diffusion type resistor as the resistor; and forming a compressive stress liner as the stress liner. Further aspects include forming a p-doped polysilicon type resistor as the resistor; and forming a tensile stress liner as the stress liner.

Another aspect of the present disclosure is a device comprising: a resistor on a substrate; and a complementary stress liner on the resistor. Aspects include an n-diffusion type resistor as the resistor; and a compressive stress liner as the stress liner. Further aspects include an p-doped polysilicon type resistor as the resistor; and a tensile stress liner as the stress liner.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Technology nodes refer to the size of features that make up the structures on a semiconductor chip, and historically have referred to the length of the silicon channel between the source and drain terminals in field effect transistors. Therefore, 45 nm technology node devices have a 45 nm channel length; 32 nm devices have a 32 nm channel length; 28 nm devices have a 28 nm channel length; and 22 nm devices will have a 22 nm channel length. A short channel device is defined as one with a channel length substantially the same as the technology node. Long channel devices are defined as devices with a channel approximately four times the technology node. For a 45 nm technology node, long channel devices have channel lengths of 175 nm or more; for a 32 nm technology node, long channel devices have a channel length of 125 nm or more; for a 28 nm technology node, long channel devices have a channel length of 100 nm or more; and for a 22 nm technology node, long channel devices will have a channel length of 90 nm or more.

Figure 1:
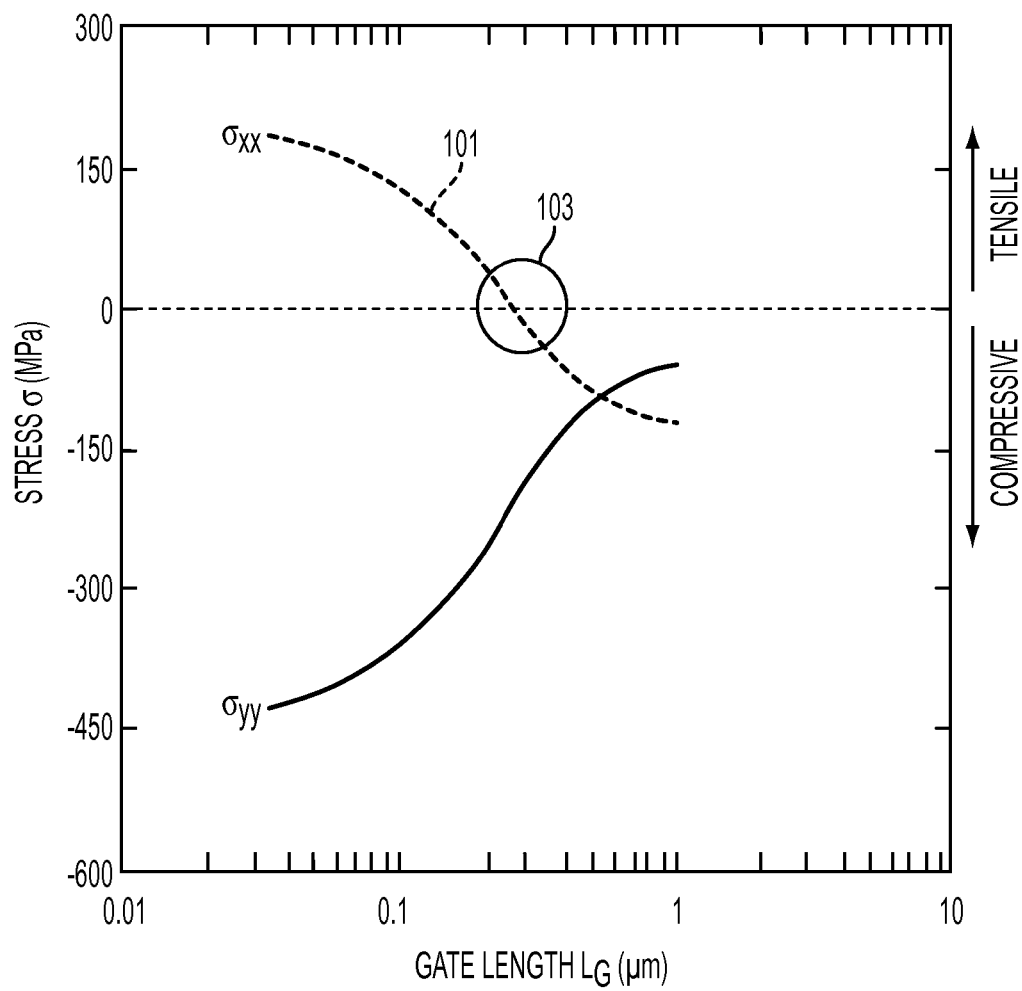
FIG. 1 schematically illustrates stress conversion in long channel devices.

An example of lateral stress $\sigma_{xx}$ and vertical stress $\sigma_{yy}$ of an NMOSFET (100 nm technology node) with a tensile stress layer is illustrated in FIG. 1. As the channel length of the NMOSFET increases, it was found that the tensile stress 101 reduces until it inverts around 250 nm (as shown at 103) and becomes a compressive stress. In other words, the stress inverts for long channel devices. Because of the complex transistor topography, i.e., the source/drain area, the spacer, and the gate for long channel devices, the intrinsic tensile stress of a tensile stressed overlayer translates into a compressive channel stress, and vice versa. Such stress inversion degrades transistor performance.

The present disclosure addresses and solves the stress inversion problem attendant upon utilizing stress overlayers for long channel devices. In accordance with embodiments of the present disclosure a complementary stressed overlayer is formed over the device. Conventionally, in short channel devices a tensile stressed overlayer is used to improve hole mobility and p-FET performance, and a compressive stressed overlayer is used to enhance electron mobility and n-FET performance. However, in accordance with the present disclosure, in long channel devices complementary liners are used, i.e., liners having a stress opposite to that conventionally used for short channel devices as noted above. Therefore, in accordance with embodiments of the present disclosure, for long channel devices a tensile stressed overlayer is used to enhance hole mobility and p-FET performance, and a compressive stressed overlayer is used to enhance electron mobility and n-FET performance. In addition, in embodiments of the present disclosure, a tensile stressed overlayer is used to enhance hole mobility and decrease the sheet resistance of a p-doped polysilicon resistor, and a compressive stressed overlayer is used to increase electron mobility and decrease the sheet resistance of an n-diffusion resistor.

Methodology in accordance with embodiments of the present disclosure includes forming a long channel semiconductor device on a substrate, and forming a complementary stress liner on the semiconductor device. Further methodology in accordance with embodiments of the present disclosure includes forming a resistor on a substrate, and tuning the resistance by forming a complementary stress liner on the resistor.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
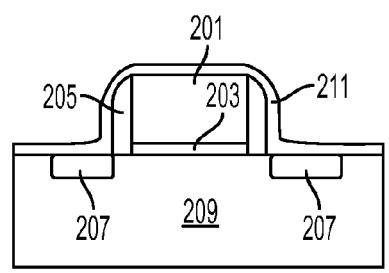
FIG. 2 schematically illustrates a prior art short channel transistor.

Adverting to FIG. 2, a short channel transistor includes gate electrode 201, gate dielectric 203, spacers 205, source/drain regions 207, channel 209 (between source/drain regions 207), and stress liner 211. Stress from stress liner 211 is coupled through the source/drain regions 207. If source/drain regions 207 are positively doped (p-doped), then channel region 209 is a p-channel, and a compressive stress liner 211 is employed to improve hole mobility. If source/drain regions 207 are negatively doped (n-doped), then channel region 211 is an n-channel, and a tensile stress liner 211 is employed to enhance electron mobility.

Figure 3:
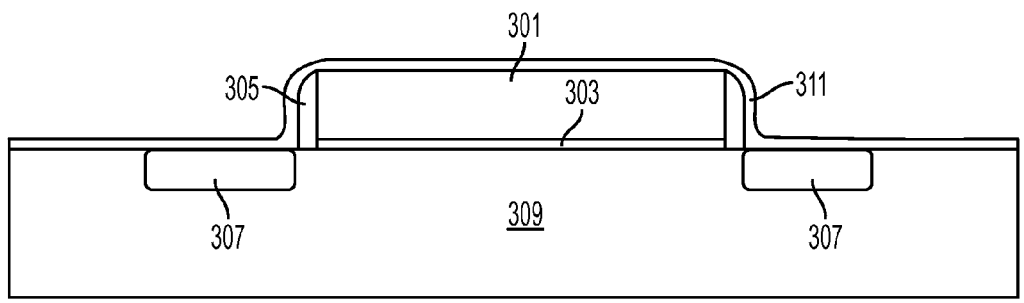
FIG. 3 schematically illustrates a long channel transistor, in accordance with an exemplary embodiment.

FIG. 3 illustrates a long channel transistor, in accordance with an exemplary embodiment, in the same technology node as the short channel transistor of FIG. 2. As shown, the long channel transistor includes gate electrode 301, gate dielectric 303, spacers 305, source/drain regions 307, channel 309 (between source/drain regions 307), and stress liner 311, all similar to the elements of the short channel device. However, the channel length is about four times that of the short channel transistor of FIG. 2, and stress from stress liner 311 is coupled through the gate rather than through the source/drain region. The stress imparted by a stress liner in a long channel device, therefore, is of opposite sign to the stress imparted by the same stress liner in a short channel device, i.e., complementary. In other words, stress liner 311 is complementary to that conventionally used for short channel devices. Therefore, for an n-channel transistor, a compressive stress liner 311 is employed (rather than a tensile stress liner) to enhance electron mobility, and for a p-channel transistor, a tensile stress liner 311 (rather than a compressive stress liner) is employed to improve electron mobility.

Long channel devices include dual gate, or thick gate, oxide (DGO) devices used for digital applications or analog ($AV_T$) devices, such as for phase logic loops. Both tensile and compressive stress liners 311 may be plasma enhanced nitride, for example enhanced silicon nitride. The thickness of stress liner 311 depends on the technology node. For example, the thickness may be 1000 Å for 130 nm technology node devices, 500 Å for 28 nm devices, or 350 Å to 400 Å for 22 nm devices. Increasing the thickness of the stress liner imparts more stress. Alternatively plasma treatment may change the stress.

Figure 4:
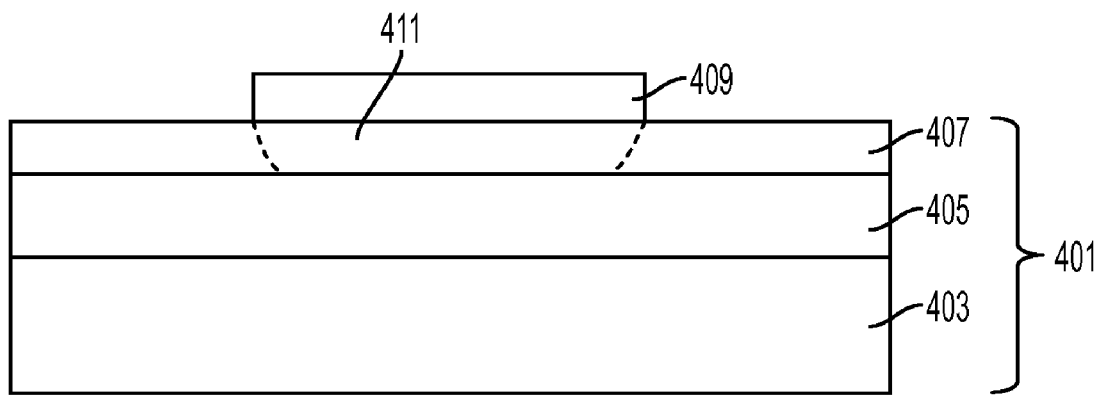
FIG. 4 schematically illustrates an n-diffusion resistor, in accordance with an exemplary embodiment.

Adverting to FIG. 4, an n-diffusion resistor in accordance with an exemplary embodiment is formed on a silicon-on-insulator (SOI) substrate 401. SOI substrate 401 includes substrate 403, buried oxide (BOX) layer 405, and silicon layer 407. A compressive stress liner 409 is formed over n-doped region 411 of silicon layer 407, inducing a biaxial tensile strain in region 411. Compressive stress liner 409 therefore increases the electron mobility and reduces the sheet resistance of the resistor. When the resistance can no longer be modulated by implants, e.g., when the required implant dose is too high, a stress liner 409 may be employed. Alternatively, the resistance may be increased by applying a tensile stress liner to n-doped region 411.

Figure 5:
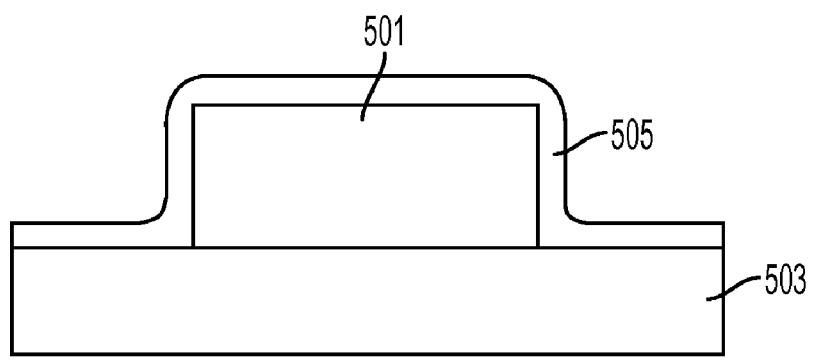
FIG. 5 schematically illustrates a p-doped polysilicon resistor, in accordance with an exemplary embodiment.

A p-doped polysilicon resistor in accordance with an exemplary embodiment is illustrated in FIG. 5. A p-doped polysilicon gate 501 is formed on silicon substrate 503. A tensile stress liner 505 is formed over a portion of the polysilicon which forms a resistor. The stress liner induces a strong compressive stress in the polysilicon. Therefore, hole mobility is enhanced and the resistance may be decreased. As with the n-diffusion resistor illustrated in FIG. 4, the resistance may be modulated with the stress liners rather than with further doping.

The embodiments of the present disclosure can achieve several technical effects, including enhancing performance of long channel devices and tuning resistance of n-diffusion and p-doped polysilicon resistors without varying implant dose or energy. The present disclosure enjoys industrial applicability in any of various types of highly integrated semiconductor devices such as 32 nm SOI and bulk silicon types devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a long channel PFET or NFET semiconductor device on a substrate; and
    forming a tensile stress liner on the PFET semiconductor device, and not thereafter removing the tensile stress liner from the PFET, or forming a compressive stress liner on the NFET semiconductor device, and not thereafter removing the compressive stress liner from the NFET.

2. The method according to claim 1, comprising forming a dual gate oxide device as the long channel device.

3. The method according to claim 2, comprising:
    forming a long channel NFET dual gate oxide device.

4. The method according to claim 2, comprising:
    forming a long channel PFET dual gate oxide device.

5. The method according to claim 1, comprising forming an analog device as the long channel device.

6. The method according to claim 5, comprising:
    forming a long channel analog NFET device.

7. The method according to claim 1, comprising:
    forming a long channel analog PFET device.

8. A device comprising:
    a long channel PFET or NFET transistor; and
    a tensile stress liner on the PFET transistor or a compressive stress liner on the NFET transistor.

9. The device according to claim 8, wherein the transistor comprises a dual gate oxide.

10. The device according to claim 9, wherein:
    the transistor comprises an NFET transistor.

11. The device according to claim 9, wherein:
    the transistor comprises a PFET transistor.

12. The device according to claim 8, wherein the transistor comprises an analog device.

13. The device according to claim 12, wherein:
    the transistor comprises an NFET transistor.

14. The device according to claim 12, wherein:
    the transistor comprises a PFET transistor.

* * * * *